(12) United States Patent
BrightSky et al.

(10) Patent No.: US 8,981,326 B2
(45) Date of Patent: Mar. 17, 2015

(54) PHASE CHANGE MEMORY CELL WITH HEAT SHIELD

(71) Applicant: International Business Machines Corporation, Armonk, NY (US)

(72) Inventors: Matthew J. BrightSky, Pound Ridge, NY (US); Chung H. Lam, Peekskill, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/785,994

(22) Filed: Mar. 5, 2013

(65) Prior Publication Data

US 2014/0252294 A1 Sep. 11, 2014

(51) Int. Cl.
*H01L 29/02* (2006.01)
*H01L 45/00* (2006.01)
(52) U.S. Cl.
CPC .................................. *H01L 45/065* (2013.01)
USPC ............... 257/2; 257/3; 257/4; 257/E29.002; 438/102; 438/103; 438/104; 438/382
(58) Field of Classification Search
USPC .......................... 257/2–5, E29.002, E47.001; 438/102–104, 382
See application file for complete search history.

(56) References Cited

U.S. PATENT DOCUMENTS

| | | | |
|---|---|---|---|
| 6,815,704 B1 | 11/2004 | Chen | 257/2 |
| 7,417,245 B2 | 8/2008 | Happ et al. | 257/2 |
| 7,601,995 B2 | 10/2009 | Happ et al. | 257/213 |
| 7,932,101 B2 | 4/2011 | Lung | 438/3 |
| 7,956,343 B2 | 6/2011 | Kwon et al. | 257/2 |
| 8,513,638 B2 * | 8/2013 | Kakegawa et al. | 257/4 |
| 2011/0068313 A1 | 3/2011 | Liu | 257/4 |
| 2013/0087756 A1 * | 4/2013 | Joseph et al. | 257/4 |

OTHER PUBLICATIONS

U. Russo et al., "Modeling of Programming and Read Performance in Phase-Change Memories—Part I: Cell Optimization and Scaling," IEEE Transactions on Electron Devices, vol. 55, No. 2, Feb. 2008, pp. 506-514.

U. Russo et al., "Modeling of Programming and Read Performance in Phase-Change Memories—Part II: Program Disturb and Mixed-Scaling Approach," IEEE Transactions on Electron Devices, vol. 55, No. 2, Feb. 2008, pp. 515-522.

(Continued)

*Primary Examiner* — Mark A Laurenzi
(74) *Attorney, Agent, or Firm* — Ido Tuchman; Vazken Alexanian

(57) ABSTRACT

A phase change memory cell, an array of the phase change memory cells, and a method for fabricating the phase change memory cells. The phase change memory cell includes a bottom electrode, a heating element, and a heat shield. During programming of the phase change memory cell, the bottom electrode passes current to the phase change memory cell. The heating element is electrically coupled to the bottom electrode and generates heat during the programming of the phase change memory cell. The heat shield is thermally conductive and surrounds at least a portion of the heating element. The heat shield conducts heat generated during programming of the phase change memory cell to the bottom electrode.

17 Claims, 21 Drawing Sheets

(56) References Cited

OTHER PUBLICATIONS

S. Kim et al., "Thermal disturbance and its impact on reliability of phase-change memory studied by the micro-thermal stage," 2010 IEEE International Reliability Physics Symposium (IRPS), May 2-6, 2010, pp. 99-103.

T.-Y. Lee et al., "Low thermal conductivity in Ge2Sb2Te5—SiOx for phase change memory devices," Applied Physics Letters, vol. 94, No. 24, Jun 2009, 243103, 3 pages.

* cited by examiner

PHASE CHANGE MEMORY CELL WITH HEAT SHIELD

BACKGROUND

This invention relates to computer memory, and more particularly, phase change memory cells.

There are two major groups in computer memory: non-volatile memory and volatile memory. Constant input of energy in order to retain information is not necessary in non-volatile memory but is required in the volatile memory. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM); non-volatile memory devices being memory in which the state of the memory elements can be retained for days to decades without power consumption. Examples of volatile memory devices include Dynamic Random Access Memory (DRAM) and Static Random Access Memory (SRAM); where DRAM requires the memory element to be constantly refreshed while SRAM requires a constant supply of energy to maintain the state of the memory element. The present invention is directed to phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials contain a chalcogen (Periodic Table Group 16/VIA) and another element. Selenium (Se) and tellurium (Te) are the two most common semiconductors in the group used to produce a chalcogenide when creating a phase change memory cell. An example of this would be $Ge_2Sb_2Te_5$ (GST), SbTe, and $In_2Se_3$.

In phase change memory, the heat necessary to drive a change between states in the phase change material propagates to adjacent materials. Heat propagating into adjacent memory cells may cause thermal cross-talk and errors in bit storage.

Phase change memory cell designs also attempt to minimize the area of each cell in order to maximize the density of the memory arrays. As the density increases, neighboring PCM cells become closer and closer and heat propagation into adjacent memory cells become a concern. Thus it is desirable to channel the heat away from the adjacent memory cells.

BRIEF SUMMARY

One example of the present invention is a phase change memory cell which includes a bottom electrode, a heating element, and a heat shield. The bottom electrode passes current to the phase change memory cell during programming of the phase change memory cell. The heating element is electrically coupled to the bottom electrode and generates heat during the programming of the phase change memory cell. The heat shield surrounds at least a portion of the heating element. The heat shield is also thermally conductive and, during programming of the phase change memory cell, conducts heat generated to the bottom electrode.

Another example of a present invention is a phase change memory array for isolating heat generated during programming of phase change memory cells. The phase change memory array includes a plurality of phase change memory cells wherein each of the phase change memory cells contains a bottom electrode, a heating element, and a heat shield. The bottom electrode passes current to the phase change memory cell during the programming of the phase change memory cell. The heating element is electrically coupled to the bottom electrode and generates heat during programming of the phase change memory cell. The heat shield surrounds at least a portion of the heating element. The heat shield is also thermally conductive and, during programming of the phase change memory cell, conducts heat generated to the bottom electrode.

Yet another example of the present invention involves a method for fabricating a phase change memory cell. The method includes first forming a bottom electrode within a substrate, forming a heat shield within the substrate and above the bottom electrode, and forming a heating element within the sidewall of the heat shield. The bottom electrode is electrically conductive. The heat shield is thermally coupled to the bottom electrode. The heat shield also includes a sidewall and extends away from the bottom electrode. The heating element is electrically coupled to the bottom electrode and configured to generate heat during programming of the phase change memory cell.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 also shows a phase change memory array for isolating heat generated during programming of phase change memory cells.

FIG. 2 also shows an alternate phase change memory array for isolating heat generated during programming of phase change memory cells.

DETAILED DESCRIPTION

Figure 1:
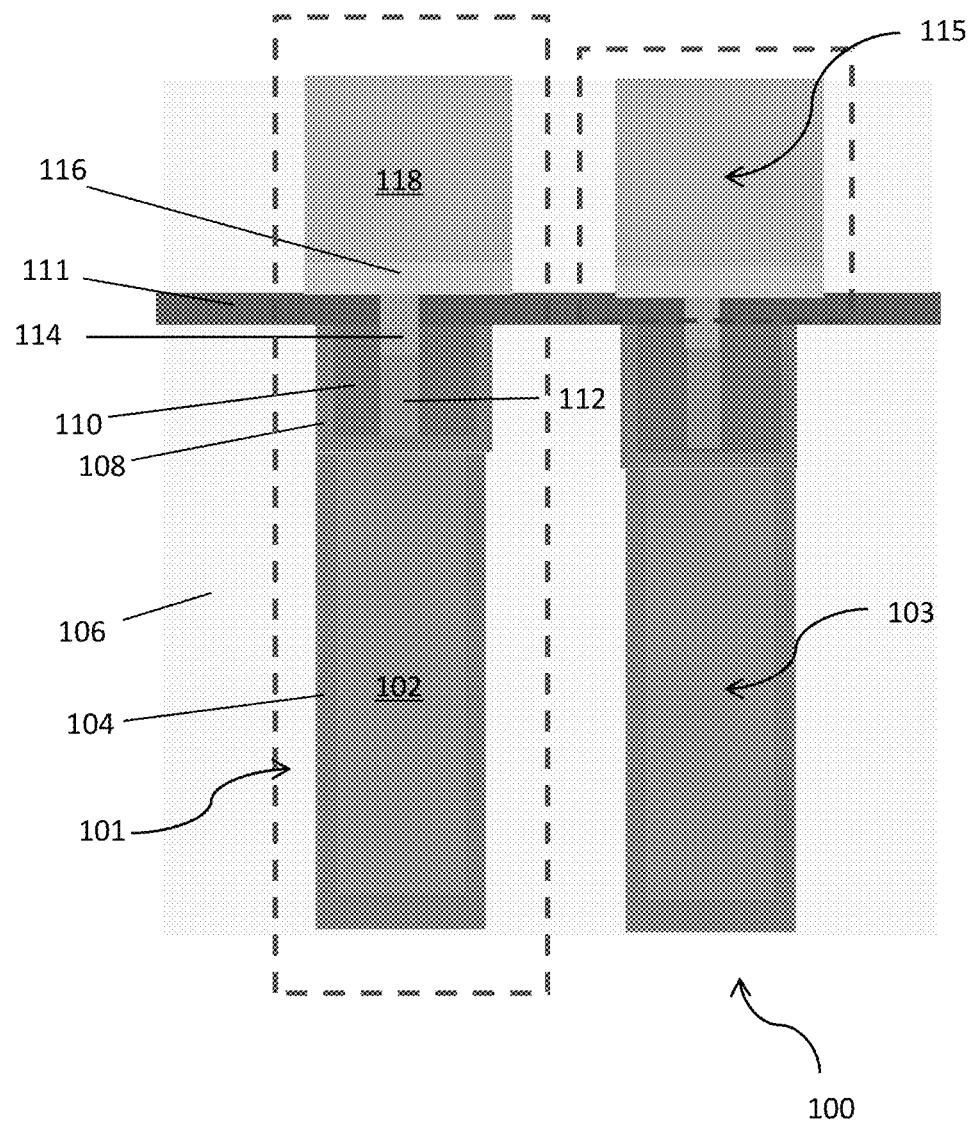
FIG. 1 shows a phase change memory cell, in accordance with one embodiment of the invention.

The present invention is described with reference to embodiments of the invention. Throughout the description of the invention reference is made to FIGS. 1-19*b*. When referring to the figures, like structures and elements shown throughout are indicated with like reference numerals.

FIG. 1 shows a phase change memory cell 101, according to one embodiment of the present invention. The phase change memory cell 101 includes a bottom electrode 103, a heating element 112, and a heat shield 108. The bottom electrode 103 may be configured to pass current to the phase change memory cell 101 during programming of the phase change memory cell 101. The heating element 112 may be electrically coupled to the bottom electrode 103. The heating element 112 may also be configured to generate heat during programming of the phase change memory cell 101. The heat shield 108 may surround a portion of the heating element 112. The heat shield 108 may also be thermally conductive. Furthermore, the heat shield 108 may conduct heat generated during programming of the phase change memory cell 101 to the bottom electrode 103.

According to one embodiment of the invention, the bottom electrode 103 may consist of a metal core 102, such as a tungsten structure, surrounded by an outer layer 104, such as a titanium nitride shell. The outer layer 104 may also include a mixture of titanium nitride and aluminum or a mixture of titanium nitride and silicon. The metal core may be deposited by a chemical vapor deposition process. The outer layer 104 may also be deposited using chemical vapor deposition.

According to another embodiment of the invention, the bottom electrode 103 may connect the phase change memory cell 101 to a substrate or to copper or aluminum lines in layers of material adjacent to the phase change memory cell. According to yet another embodiment of the invention, the heat shield 108 may consist of tantalum nitride, titanium nitride, or titanium nitride mixed with either aluminum or silicon. The heat shield may be formed using a chemical vapor deposition (CVD) process or an atomic layer deposition (ALD) process. The heat shield 108 may also consist of silicon deposited using a low pressure chemical vapor deposition (LP-CVD) process.

Furthermore, the heating element 112 may include phase change material. In one embodiment, the heating element 112 is made entirely of phase change material. In another embodiment, the heating element may include phase change material and non-phase change material. For example, the deposition of heating element 112 is a non-phase change material liner followed by a phase change material.

The phase change material is selectively settable to at least two states having different electrical resistivity. For example, the phase change material may be a material selectively configurable to either a first phase having a first electrical resistance or a second phase having a second electrical resistance, where the first electrical resistance is greater than the second electrical resistance. In one embodiment, the phase change material may include a Germanium-Antimony-Tellurium compound (GST). The phase change material may also be thermally configurable.

In one embodiment of the invention, the phase change memory cell 101 also includes a top electrode 114 that is electrically coupled to the heating element 112. The top electrode 114 may be configured to pass current from the phase change memory cell 101 during programming of the phase change memory cell 101. According to another embodiment of the invention, the top electrode 114 includes a material that is not phase change material. The top electrode 114 may also include titanium nitride.

In another one embodiment of the invention, the top electrode 114 may be in contact with a bit line 115. The bit line 115 may consist of a layer of metal 118 such, as copper, tungsten, or aluminum. Between the top electrode 114 and the layer of metal 118, the bit line 115 may also include a layer of liner 116, such as tantalum nitride or titanium nitride.

FIG. 1 also shows a phase change memory array 100 for isolating heat generated during programming of phase change memory cells 101, according to one embodiment of the invention. The phase change memory array 100 comprises a plurality of phase change memory cells 101. Each of the phase change memory cells 101 includes a bottom electrode 103, a heating element 112, and a heat shield 108.

The bottom electrode 103 may be configured to pass current to the phase change memory cell 101 during programming of the phase change memory cell 101. The heating element 112 may be electrically coupled to the bottom electrode 103. Furthermore, the heating element 112 may be configured to generate heat during programming of the phase change memory cell 101. The heat shield 108 may surround all or part of the heating element 112. Furthermore, the heat shield 108 may be thermally conductive and conduct heat generated during programming of the phase change memory cell 101 to the bottom electrode 103.

According to one embodiment of the invention, the bottom electrode 103 may consist of a metal core 102, such as a tungsten structure, surrounded by an outer layer 104, such as a titanium nitride shell. The outer layer 104 may also include a mixture or titanium nitride and aluminum or a mixture of titanium nitride and silicon. The metal core may be deposited by a chemical vapor deposition process. The outer layer 104 may also be deposited using chemical vapor deposition.

According to another embodiment of the invention, the bottom electrode 103 may connect the phase change memory cell to a substrate or to copper or aluminum lines in layers of material adjacent to the phase change memory cell.

The heat shield 108 may consist of tantalum nitride, titanium nitride, or titanium nitride mixed with either aluminum or silicon. The heat shield 108 may be formed using a chemical vapor deposition (CVD) process or an atomic layer deposition (ALD) process. The heat shield 108 may also consist of silicon deposited using a low pressure chemical vapor deposition (LP-CVD) process.

According to another embodiment of the invention, a top electrode 114 may be electrically coupled to the heating element 112. The top electrode 114 may also be electrically coupled to the heating element 112. The top electrode 114 may also configured to pass current from the phase change memory cell 101 during programming of the phase change memory cell 101.

According to another embodiment of the invention, the heating element 112 may include phase change material. The phase change material may be selectively settable to at least two states having different electrical resistivity. For example, the phase change material may be selectively configurable to either a first phase having a first electrical resistance or a second phase having a second electrical resistance, wherein the first electrical resistance is greater than the second electrical resistance. For example, the phase change material may include a Germanium-Antimony-Tellurium compound (GST). The top electrode 114 may also include a material that is not phase change material. The top electrode may also include titanium nitride. Additionally, the phase change material may be thermally configurable.

In another one embodiment of the invention, the top electrode 114 may be in contact with a bit line 115. The bit line 115 may consist of a layer of metal 118 such, as copper, tungsten, or aluminum. Between the top electrode 114 and the layer of metal 118, the bit line 115 may also include a layer of liner 116, such as tantalum nitride or titanium nitride.

Figure 2:
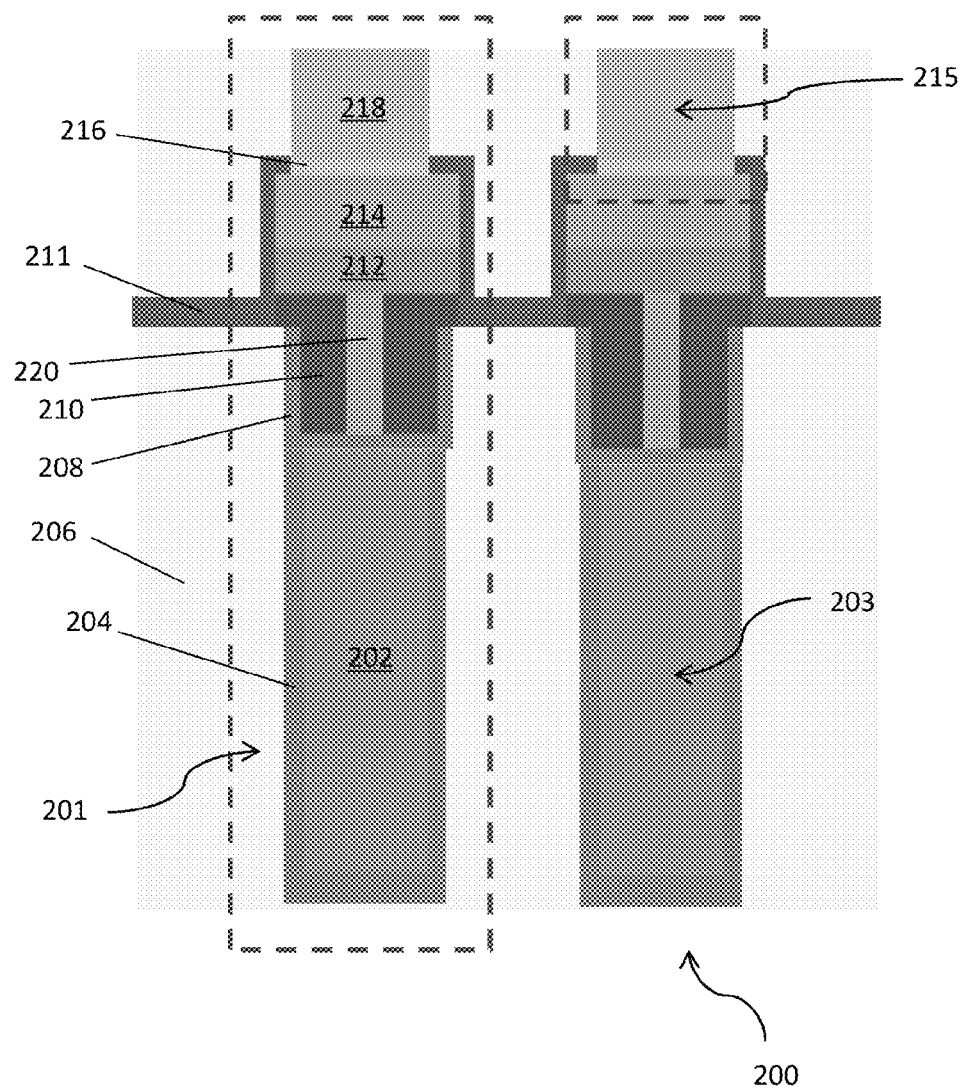
FIG. 2 shows a phase change memory cell, in accordance with an alternate embodiment of the present invention.

FIG. 2 shows a phase change memory cell 201, in accordance with an alternate embodiment of the present invention. The phase change memory cell 201 includes a bottom electrode 203, a heating element 220, and a heat shield 208. The bottom electrode 203 may be configured to pass current to the phase change memory cell 201 during programming of the phase change memory cell 201. The heating element 220 may be electrically coupled to the bottom electrode 203. The heating element 220 may also be configured to generate heat during programming of the phase change memory cell 201. The heat shield 208 may surround a portion of the heating element 220. The heat shield 208 may also be thermally conductive. Furthermore, the heat shield 208 may conduct heat generated during programming of the phase change memory cell 201 to the bottom electrode 203.

According to one embodiment of the invention, the bottom electrode 203 may consist of a metal core 202, such as a tungsten structure, surrounded by an outer layer 204, such as a titanium nitride shell. The outer layer 204 may also include a mixture or titanium nitride and aluminum or a mixture of titanium nitride and silicon. The metal core may be deposited by a chemical vapor deposition process. The outer layer 204 may also be deposited using chemical vapor deposition.

According to another embodiment of the invention, the bottom electrode 204 may connect the phase change memory cell to a substrate or to copper or aluminum lines in layers of material adjacent to the phase change memory cell 201.

According to one embodiment of the invention, the heat shield 208 may consist of tantalum nitride, titanium nitride, or titanium nitride mixed with either aluminum or silicon. The heat shield may be formed using a chemical vapor deposition (CVD) process or an atomic layer deposition (ALD) process. The heat shield 208 may also consist of silicon deposited using a low pressure chemical vapor deposition (LP-CVD) process.

In one embodiment of the invention, the phase change memory cell 201 may also include a layer of phase change material 212 that is electrically coupled to the heating element 220. The layer of phase change material 212 may be selectively configurable to either a first phase having a first electrical resistance or a second phase having a second electrical resistance, wherein the first electrical resistance is greater than the second electrical resistance. For example, the phase change material may include a Germanium-Antimony-Tellurium compound (GST). Additionally, the layer of phase change material 212 may be thermally configurable.

In another embodiment of the invention, the heating element 220 may include a material that is not phase change material. In another one embodiment of the invention, the top electrode 214 may be in contact with a bit line 215. The bit line 214 may consist of a layer of metal 218 such, as copper, tungsten, or aluminum. Between the top electrode 214 and the layer of metal 218, the bit line 214 may also include a layer of liner 216, such as tantalum nitride or titanium nitride.

FIG. 2 also shows a phase change memory array 200 for isolating heat generated during programming of phase change memory cells 201, according to another embodiment of the invention. The phase change memory array 200 comprises a plurality of phase change memory cells 201. Each of the phase change memory cells 201 includes a bottom electrode 203, a heating element 220, and a heat shield 208.

The bottom electrode 203 may be configured to pass current to the phase change memory cell 201 during programming of the phase change memory cell 201. The heating element 220 may be electrically coupled to the bottom electrode 203. Furthermore, the heating element 220 may be configured to generate heat during programming of the phase change memory cell 201. The heat shield 208 may surround all or part of the heating element 220. Furthermore, the heat shield 208 may be thermally conductive and conduct heat generated during programming of the phase change memory cell 201 to the bottom electrode 203.

According to one embodiment of the invention, the bottom electrode 203 may consist of a metal core 202, such as a tungsten structure, surrounded by an outer layer 204, such as a titanium nitride shell. The outer layer 204 may also include a mixture or titanium nitride and aluminum or a mixture of titanium nitride and silicon. The metal core may be deposited by a chemical vapor deposition process. The outer layer 104 may also be deposited using chemical vapor deposition.

According to another embodiment of the invention, the bottom electrode 203 may connect the phase change memory cell 201 to a substrate or to copper or aluminum lines in layers of material adjacent to the phase change memory cell 201.

According to one embodiment of the invention, the heat shield 208 may consist of tantalum nitride, titanium nitride, or titanium nitride mixed with either aluminum or silicon. The heat shield may be formed using a chemical vapor deposition (CVD) process or an atomic layer deposition (ALD) process. The heat shield 208 may also consist of silicon deposited using a low pressure chemical vapor deposition (LP-CVD) process.

According to one embodiment of the invention, the phase change memory array 200 includes a layer of phase change material 212 that is electrically coupled to the heating element 220. The layer of phase change material 212 may be selectively settable to at least two states having different electrical resistivity. For example, the phase change material may include a Germanium-Antimony-Tellurium compound (GST). Furthermore, the layer of phase change material 212 may thermally configurable.

According to another embodiment of the invention, the heating element 220 may be electrically conductive. The heating element 220 may also include a material that is not phase change material. According to another embodiment of the invention, a top electrode 214 may be electrically coupled to the heating element 220. The top electrode 214 may also include titanium nitride.

In another one embodiment of the invention, the top electrode 214 may be in contact with a bit line 215. The bit line 215 may consist of a layer of metal 218 such, as copper, tungsten, or aluminum. Between the top electrode 214 and the layer of metal 218, the bit line 214 may also include a layer of liner 216, such as tantalum nitride or titanium nitride.

Figure 3A:
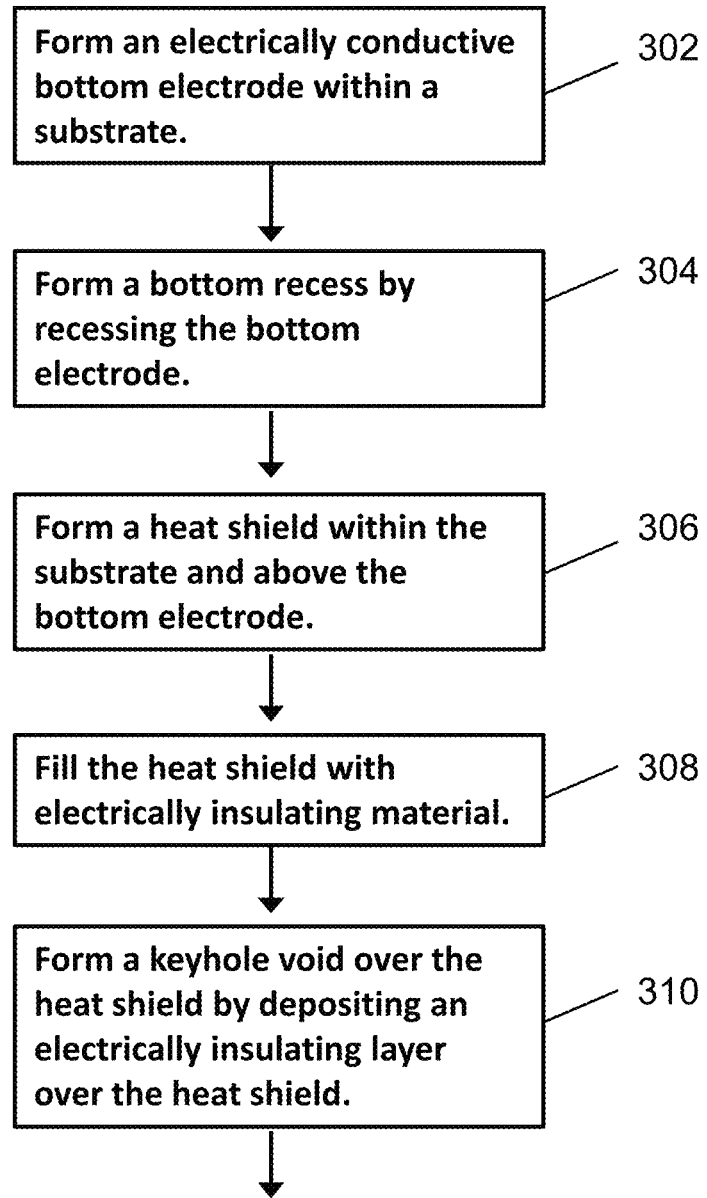
FIGS. 3a-3b show a continuous flowchart illustrating a first example method for fabricating a phase change memory cell, in accordance with one embodiment of the invention.
Figure 3B:
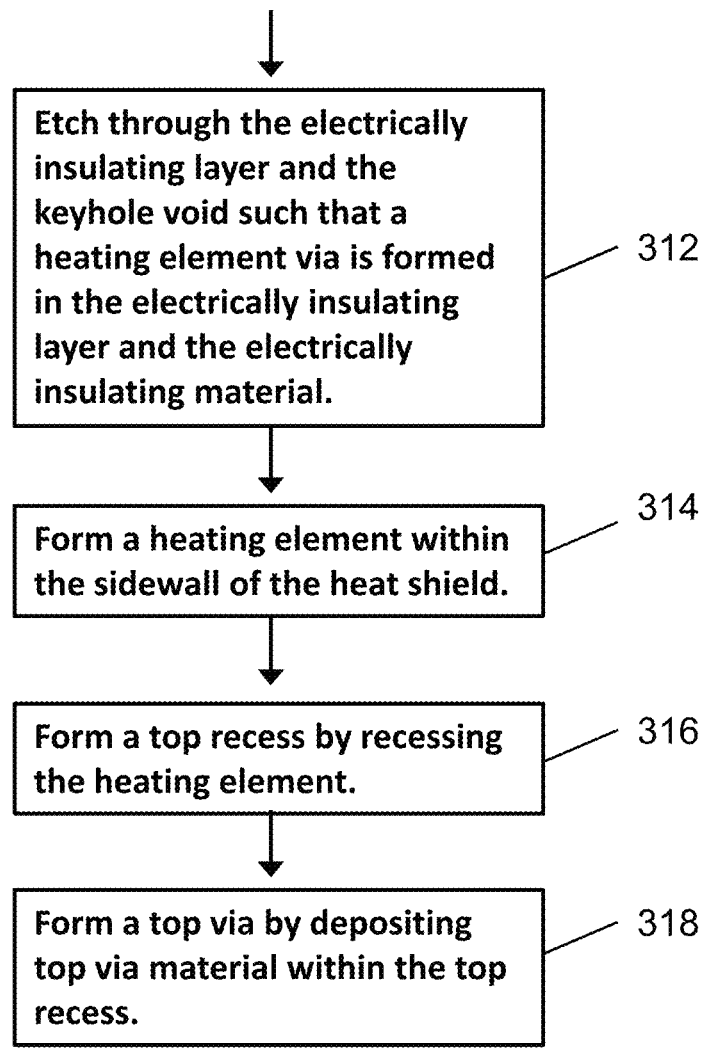
Figure 4:
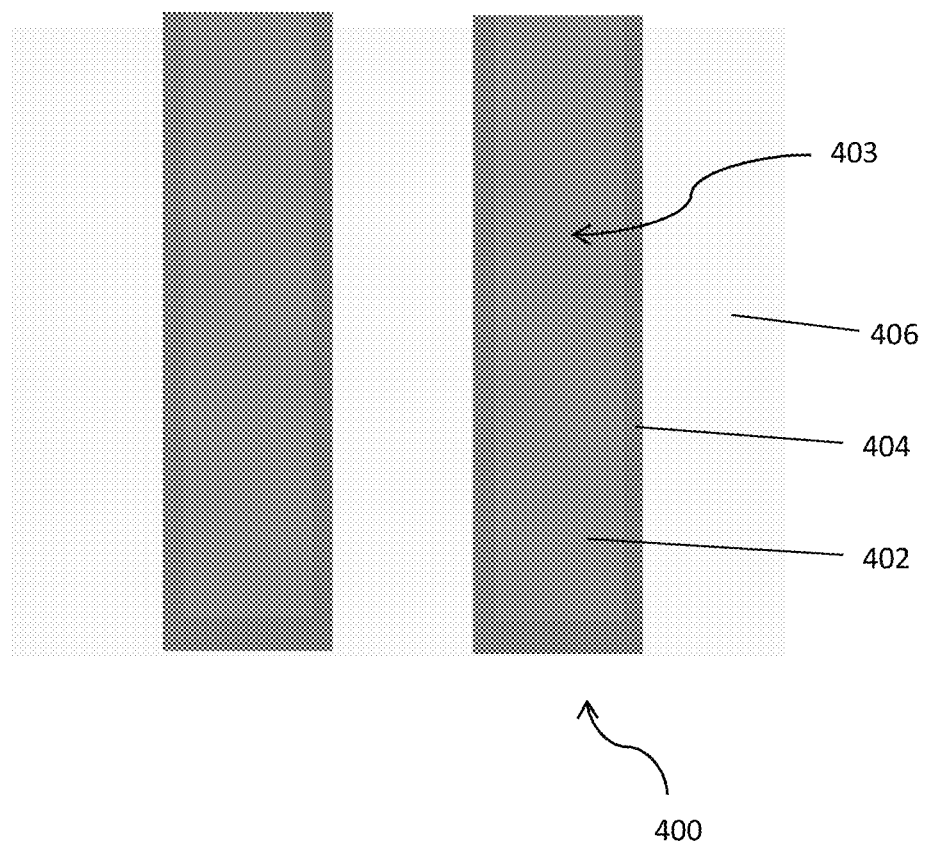
FIG. 4 shows a bottom electrode formation step, in accordance with the first example method for fabricating a phase change memory cell.

FIGS. 3a-3b show a continuous flowchart illustrating a first example method for fabricating a phase change memory cell, in accordance with one embodiment of the invention. The method involves a bottom electrode formation step 302, as shown in FIG. 4. During bottom electrode formation step 302, an electrically conductive bottom electrode 403 is formed within a substrate 406. The bottom electrode may be electrically conductive.

According to one embodiment of the invention, the bottom electrode 403 may consist of a metal core 402, such as a tungsten structure, surrounded by an outer layer 404, such as a titanium nitride shell. The outer layer 404 may also include a mixture or titanium nitride and aluminum or a mixture of titanium nitride and silicon. The metal core 402 may be deposited by a chemical vapor deposition process. The outer layer 404 may also be deposited using chemical vapor deposition.

According to another embodiment of the invention, the bottom electrode 403 may connect the phase change memory cell to a substrate or to copper or aluminum lines in layers of material adjacent to the phase change memory cell 400.

Figure 5:
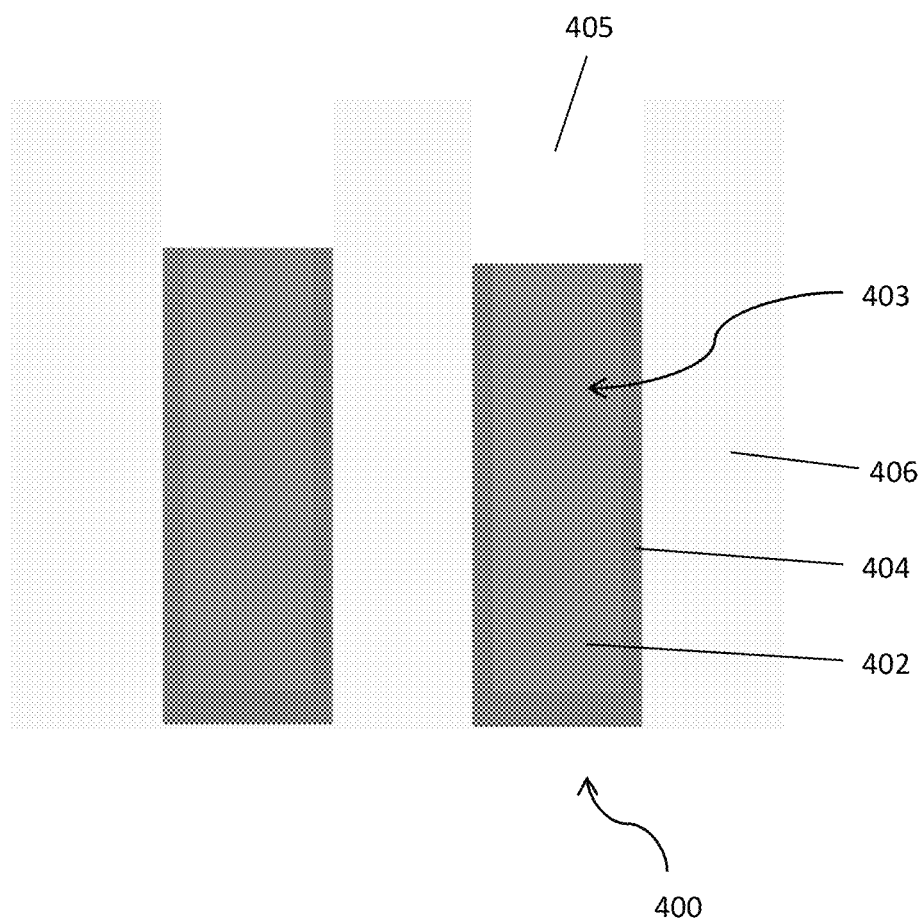
FIG. 5 shows a bottom electrode recessing step, in accordance with the first example method for fabricating a phase change memory cell.

Returning to FIGS. 3a-3b, after bottom electrode formation step 302 is complete, the process proceeds to bottom electrode recessing step 304. At bottom electrode recessing step 304, a recess 405 was formed by recessing the bottom electrode 403, as shown in FIG. 5. According to one embodiment of the invention the bottom electrode 403 may be recessed using a dry etch or a reactive ion etch (RIE).

Figure 6:
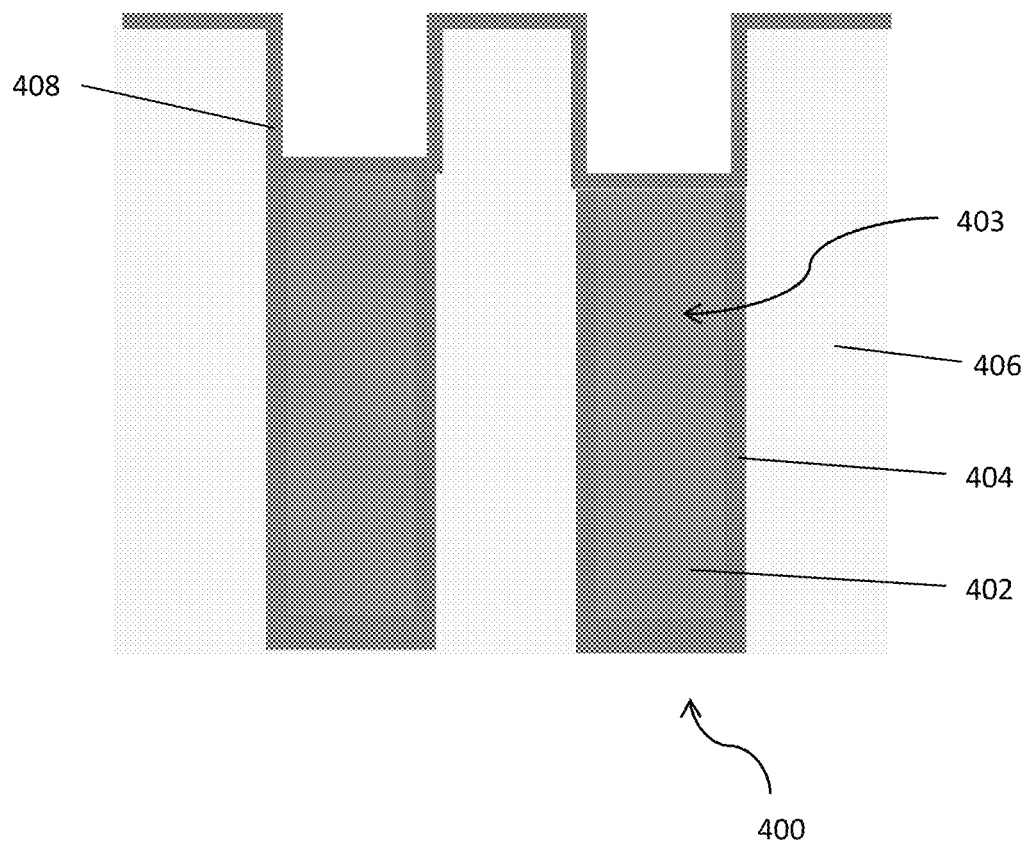
FIG. 6 shows a heat shield formation step, in accordance with the first example method for fabricating a phase change memory cell.

Returning to FIGS. 3a-3b, after bottom electrode recessing step 304 is complete, the process proceeds to heat shield formation step 306. At heat shield formation step 306, a heat shield 408 is formed within the substrate and above the bottom electrode 403, as shown in FIG. 6. According to one embodiment of the invention, the heat shield may be thermally conductive. The heat shield 408 may be thermally coupled to the bottom electrode 403, and the heat shield 408 may include a sidewall and extend away from the bottom electrode 403.

According to one embodiment of the invention, the heat shield 408 may consist of tantalum nitride, titanium nitride, or titanium nitride mixed with either aluminum or silicon. The heat shield 408 may be formed using a chemical vapor deposition (CVD) process or an atomic layer deposition (ALD) process. The heat shield 408 may also consist of silicon deposited using a low pressure chemical vapor deposition (LP-CVD) process.

Figure 7:
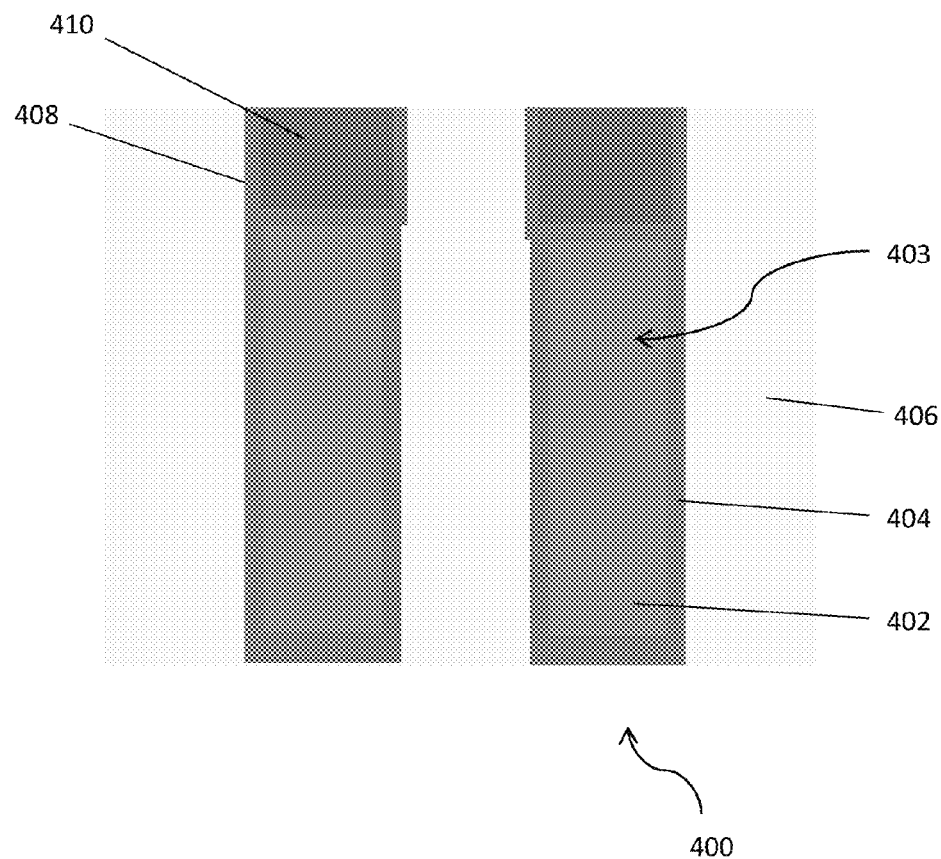
FIG. 7 shows an insulation step, in accordance with the first example method for fabricating a phase change memory cell.

Returning to FIGS. 3a-3b, after heat shield formation step 306 is complete, the process proceeds to insulation step 308. At insulation step 308, the heat shield 408 is filled with electrically insulating material 410, as shown in FIG. 7.

According to one embodiment of the invention, the electrically insulating material 410 may contain silicon nitride or silicon dioxide. The insulation step may proceed by first overfilling the heat shield 408 with the electrically insulating material 410 and then planarizing the material using a chemical mechanical polishing (CMP) process. The CMP process may consume surface portions of the heat shield material.

Figure 9:
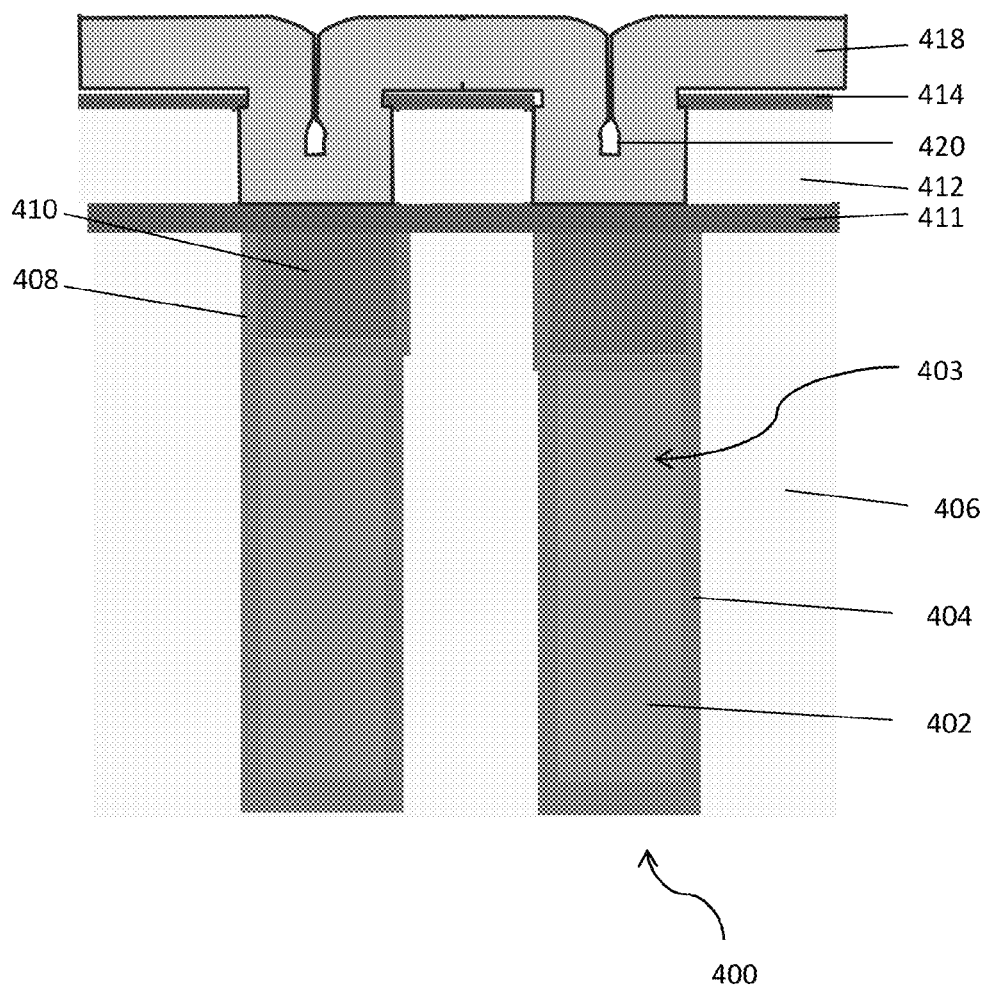
FIG. 9 shows a keyhole void insulation step, in accordance with the first example method for fabricating a phase change memory cell.

Returning to FIGS. 3a-3b, after insulation step 308 is complete, the process proceeds to keyhole void formation step 310. At keyhole void insulation step, 310, a keyhole void 420 is formed over the heat shield 408 by depositing an electrically insulating layer 418 over the heat shield, as shown in FIG. 9. The electrically insulating layer 418 may define the keyhole void 420.

Figure 8:
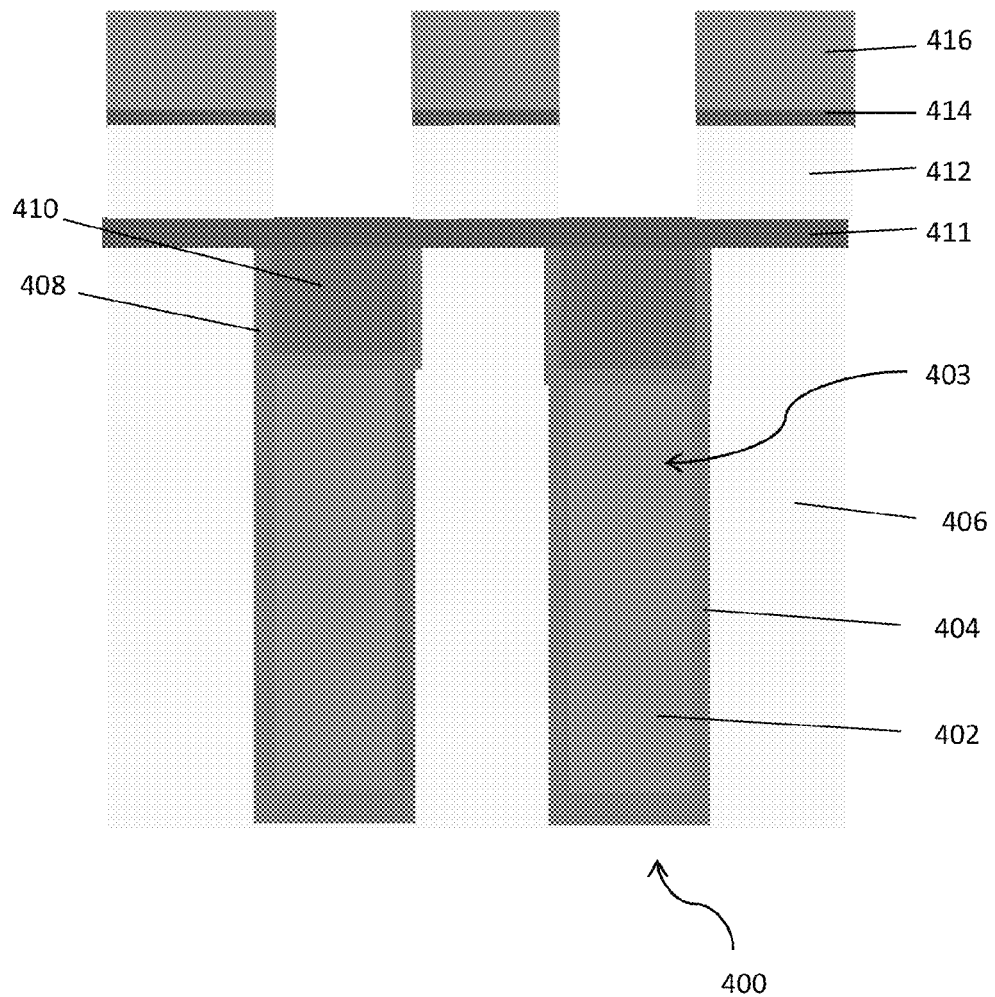
FIG. 8 shows the deposition and etching of an insulation layer, a silicon dioxide layer, a silicon nitride layer, and a photoresist layer over an insulation-filled heat shield.

According to one embodiment of the invention, the keyhole void 420 is formed by first forming a series of layers: an insulation layer 411, a silicon dioxide layer 412, a silicon nitride layer 414, and a photoresist layer 416, over the insulation-filled heat shield 408, as shown in FIG. 8. A recess in these layers is formed by using standard photolithographic techniques remove sections of the photoresist layer 416. Standard etching techniques may then be used to deepen the recess through the silicon nitride 414 and silicon dioxide layers 412. For example, the recess may be deepened via a selective wet etch process using either dilute hydrofluoric acid (DHF) or a buffered oxide etch solution (BOE). The remaining photoresist layer 416 may then be stripped using oxygen plasma. In one embodiment of the invention the insulation layer 411 may include silicon nitride or silicon dioxide.

An electrically insulating layer 418 may then be deposited into the newly formed recess, forming a keyhole void 420, as shown in FIG. 9. The electrically insulating layer may include amorphous silicon.

Figure 10:
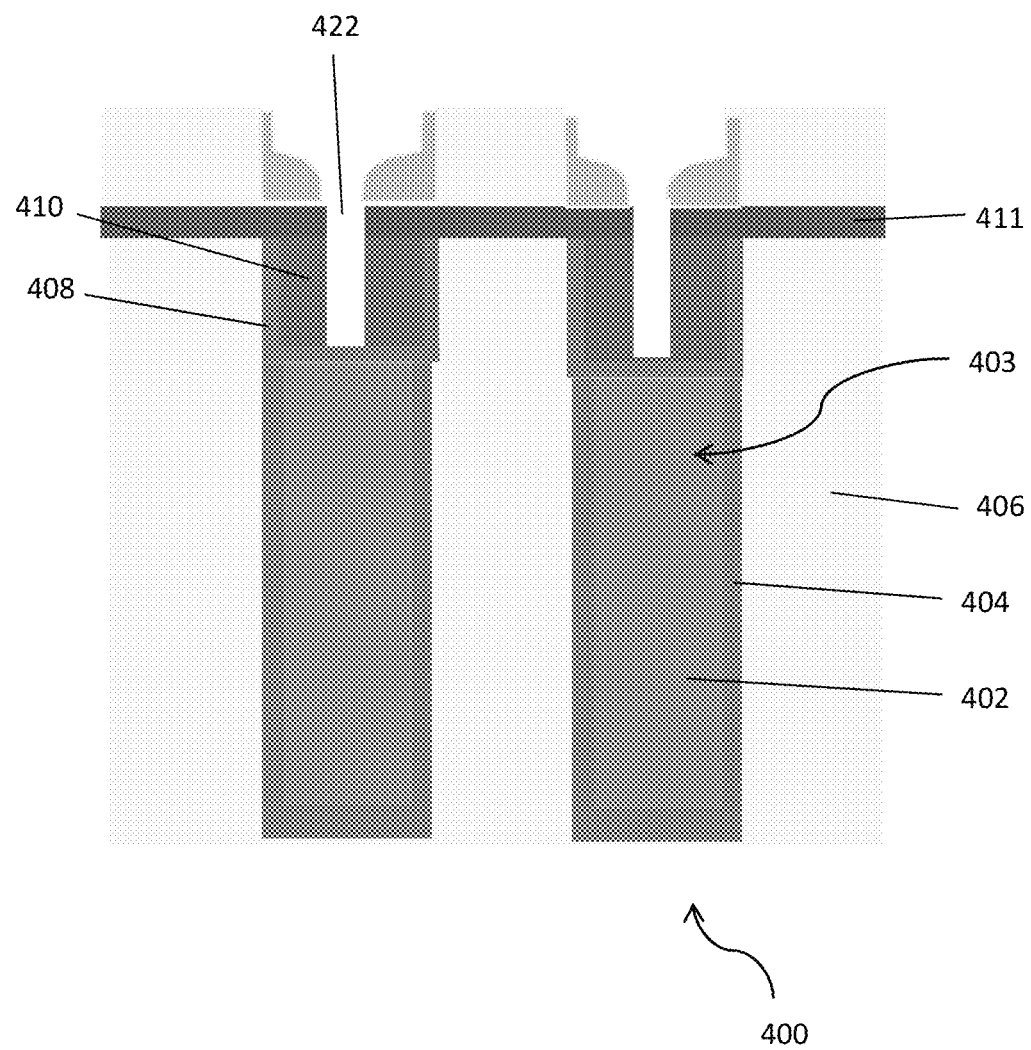
FIG. 10 shows an etching step, in which a heating element via is etched an electrically insulating layer and the keyhole void.

Returning to FIGS. 3a-3b, after the keyhole void insulation step 310 is complete, the process proceeds to etching step 312. At etching step 312, the electrically insulating layer 418 and the keyhole void 420 are etched through so that a heating element via 422 is formed in the electrically insulating layer 418 and the electrically insulating material 420, as shown in FIG. 10. The heating element via 422 may terminate at the heat shield 408. Furthermore, the heating element 424 may be formed within the heating element via.

Figure 11:
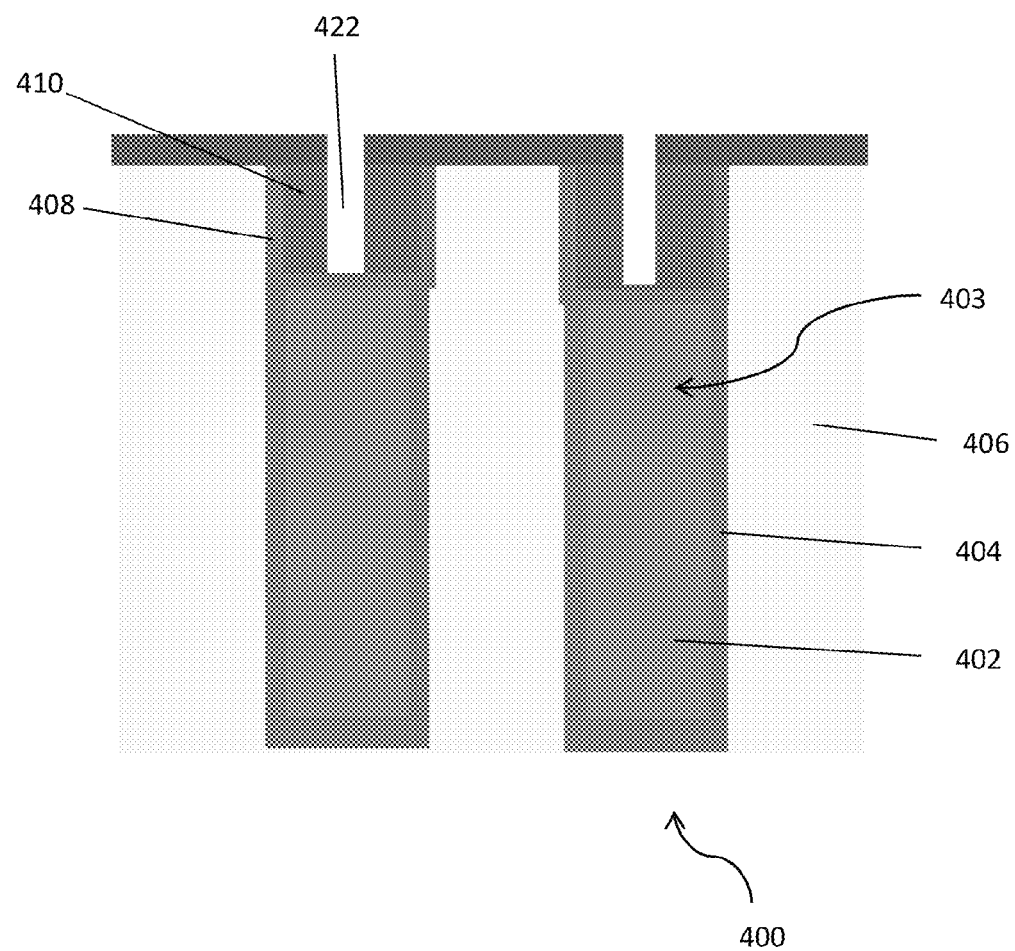
FIG. 11 shows the memory cell after removing leftover silicon dioxide and leftover electrically insulating material.

According to one embodiment of the invention, the keyhole void 420 may be transferred through the electrically insulating layer 418, insulation layer 411, and electrically insulating material 420, using a reactive ion etch process and forming the heating element via 411. The electrically insulating layer may include amorphous silicon. If the electrically insulating layer includes amorphous silicon, the remaining amorphous silicon may then be removed using tetramethylammonium hydroxide (TMAH). Any remaining surface silicon dioxide may be removed using dilute hydrofluoric acid (DHF), as shown in FIG. 11.

Figure 12:
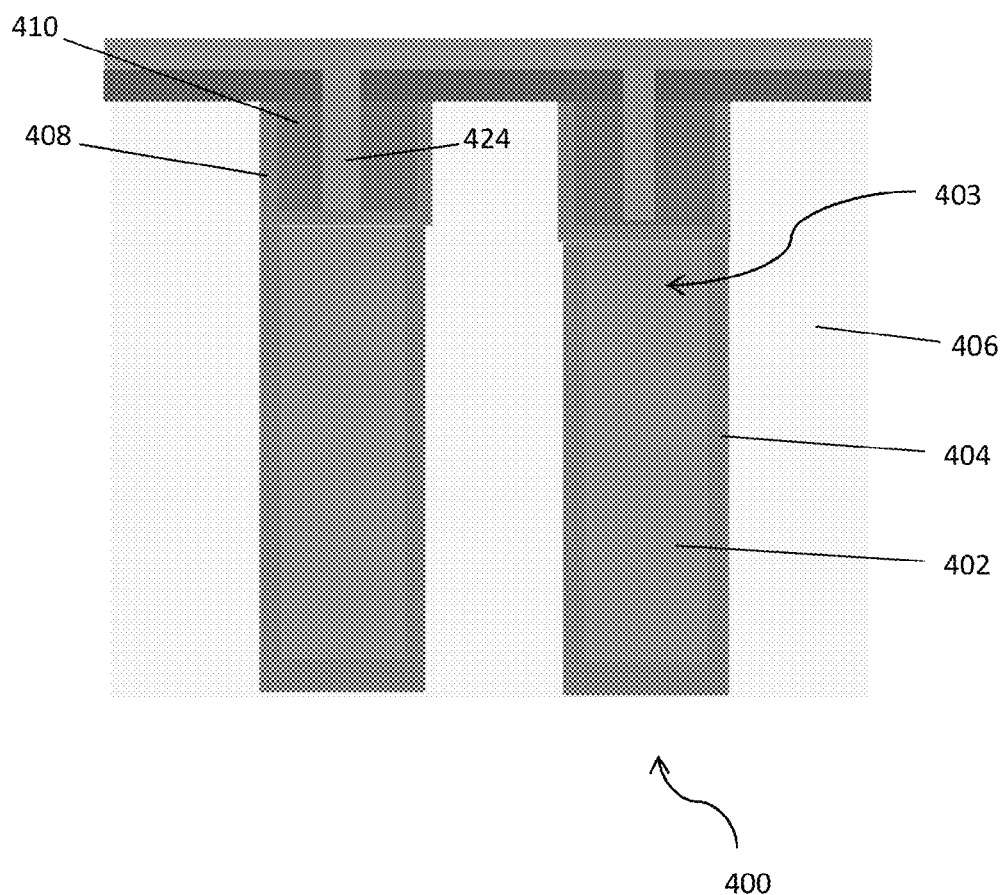
FIG. 12 shows a heating element formation step, in accordance with the first example method for fabricating a phase change memory cell.

Returning to FIGS. 3a-3b, after etching step 312 is complete, the process proceeds to heating element formation step 314. At heating element formation step 314, a heating element 424 is formed within the sidewall of the heat shield 408, as shown in FIG. 12. The heating element 424 may be electrically coupled to the bottom electrode 403 and configured to generate heat during programming of the phase change memory cell. Furthermore, the electrically insulating material 410 may surround the heating element 424.

Additionally, the heating element 424 may include phase change material selectively configurable to either a first phase having a first electrical resistance or a second phase having a second electrical resistance. The first electrical resistance may be greater than the second electrical resistance. For example, the phase change material may include a Germanium-Antimony-Tellurium compound (GST).

Figure 13:
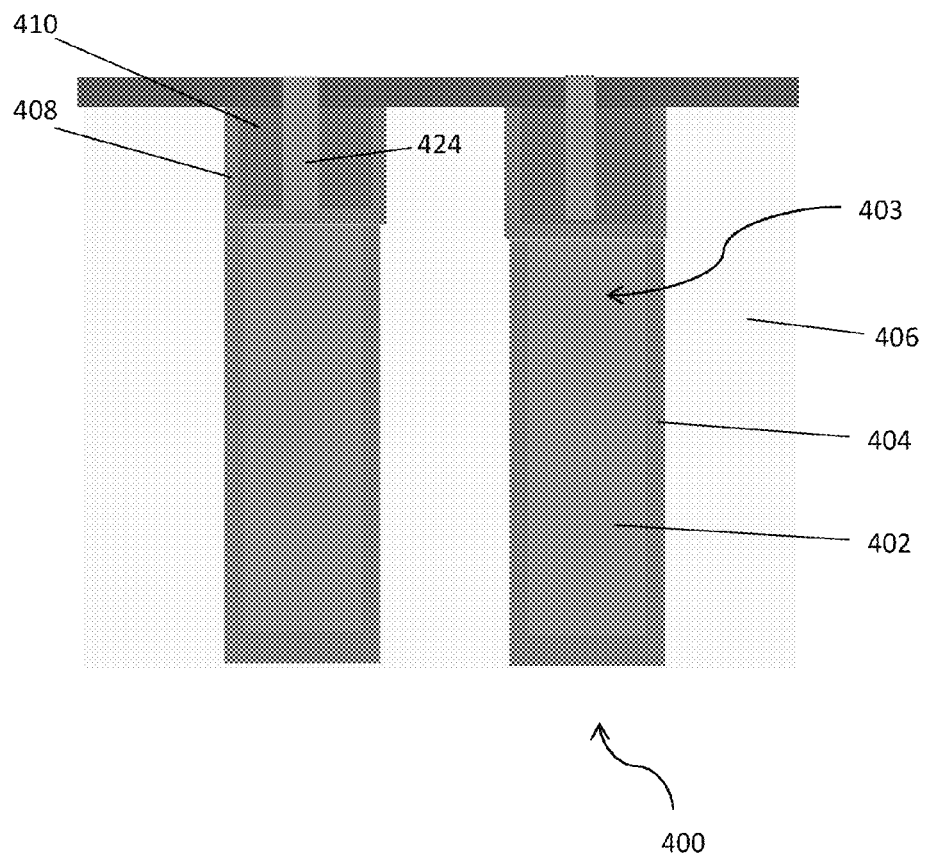
FIG. 13 shows the memory cell after removing excess phase change material.

According to one embodiment of the invention, the phase change material may be deposited using an atomic layer deposition, chemical vapor deposition, or physical vapor deposition process, as shown in FIG. 12. Excess phase change material may then be removed using a chemical mechanical polishing process, as shown in FIG. 13.

Figure 14:
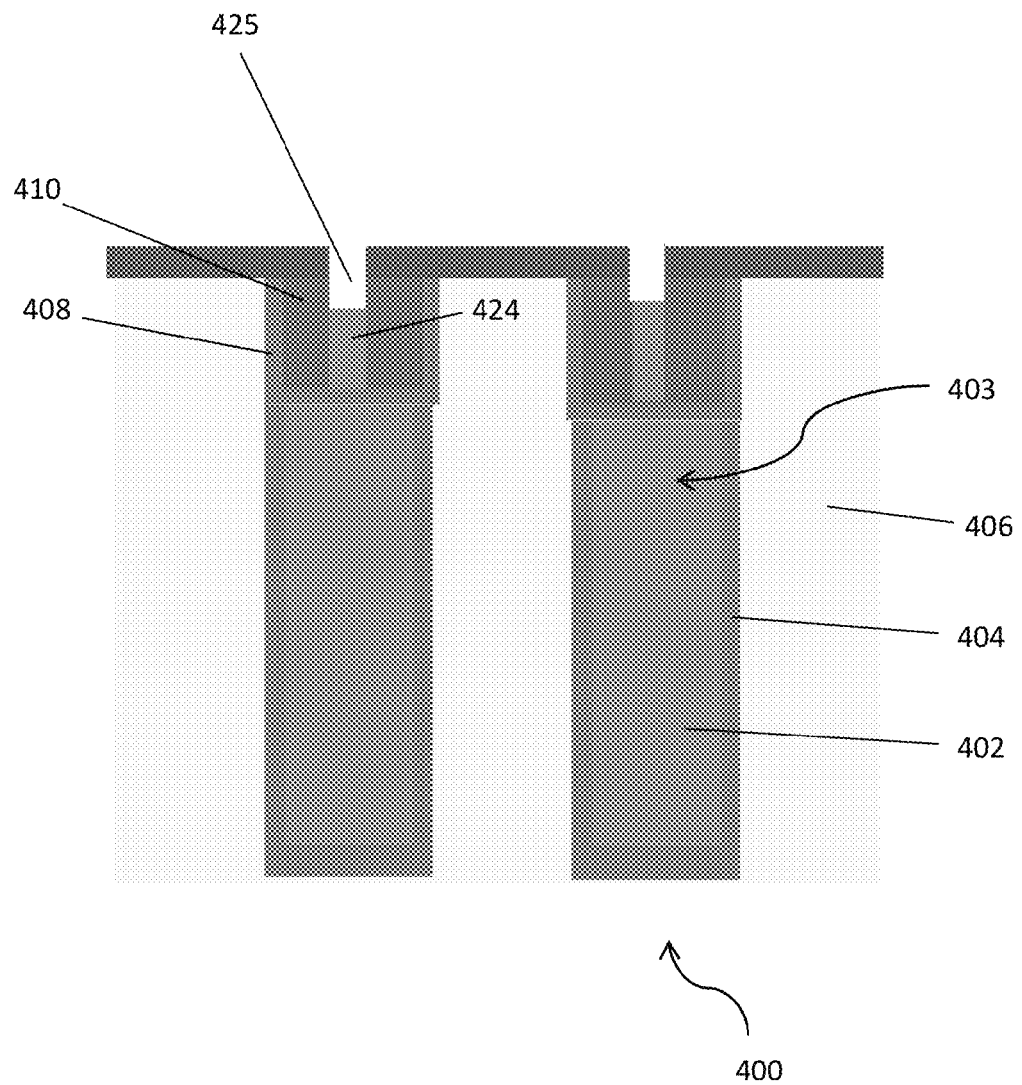
FIG. 14 shows a top recess formation step, involving recessing the heating element, in accordance with the first example method for fabricating a phase change memory cell.

Returning to FIGS. 3a-3b, after heating element formation step 314 is complete, the process proceeds to top recess formation step 316. At top recess formation step 316, a top recess 425 is formed by recessing the heating element 424, as shown in FIG. 14. According to one embodiment of the invention, the top recess 425 may be formed using a physical vapor deposition process such as argon sputtering.

Figure 15:
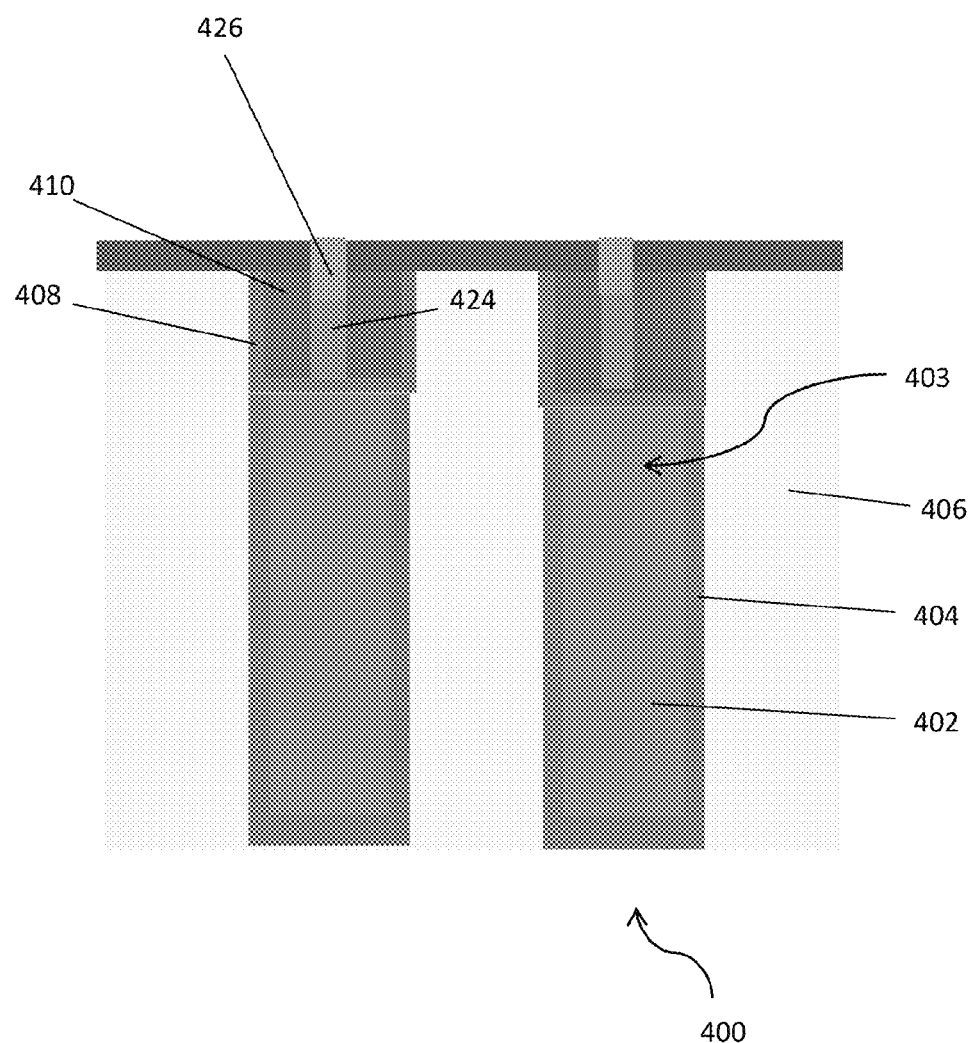
FIG. 15 shows a top electrode formation step, involving depositing top electrode material within the top recess, in accordance with the first example method for fabricating a phase change memory cell.

Returning to FIGS. 3a-3b, after top recess formation step 316 is complete, the process proceeds to top electrode formation step 318. At top electrode formation step 318, the top electrode 426 is formed by depositing top electrode material within the top recess 425, as shown in FIG. 15. The top electrode material may include titanium nitride.

In one embodiment of the invention, after top electrode material is deposited into the top recess, excess top electrode material may be removed using a chemical mechanical polishing process (CMP).

According to another embodiment of the invention, the insulation layer 411 may prevent an electrical short between the sidewalls of the heat shield 408 and the top electrode 426, requiring any current between these two components to flow through the heating element 424.

Figure 16:
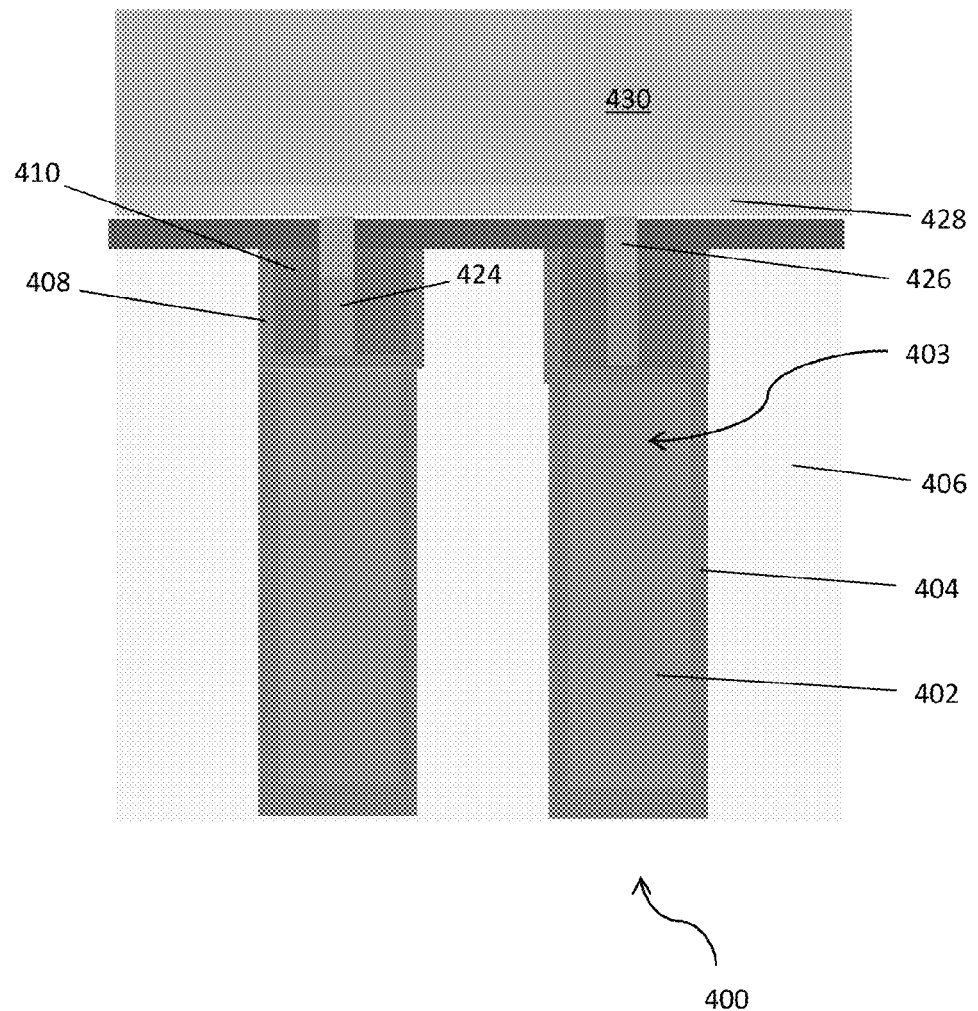
FIG. 16 shows a memory cell after depositing a layer of tantalum nitride, followed by a layer of copper.
Figure 17:
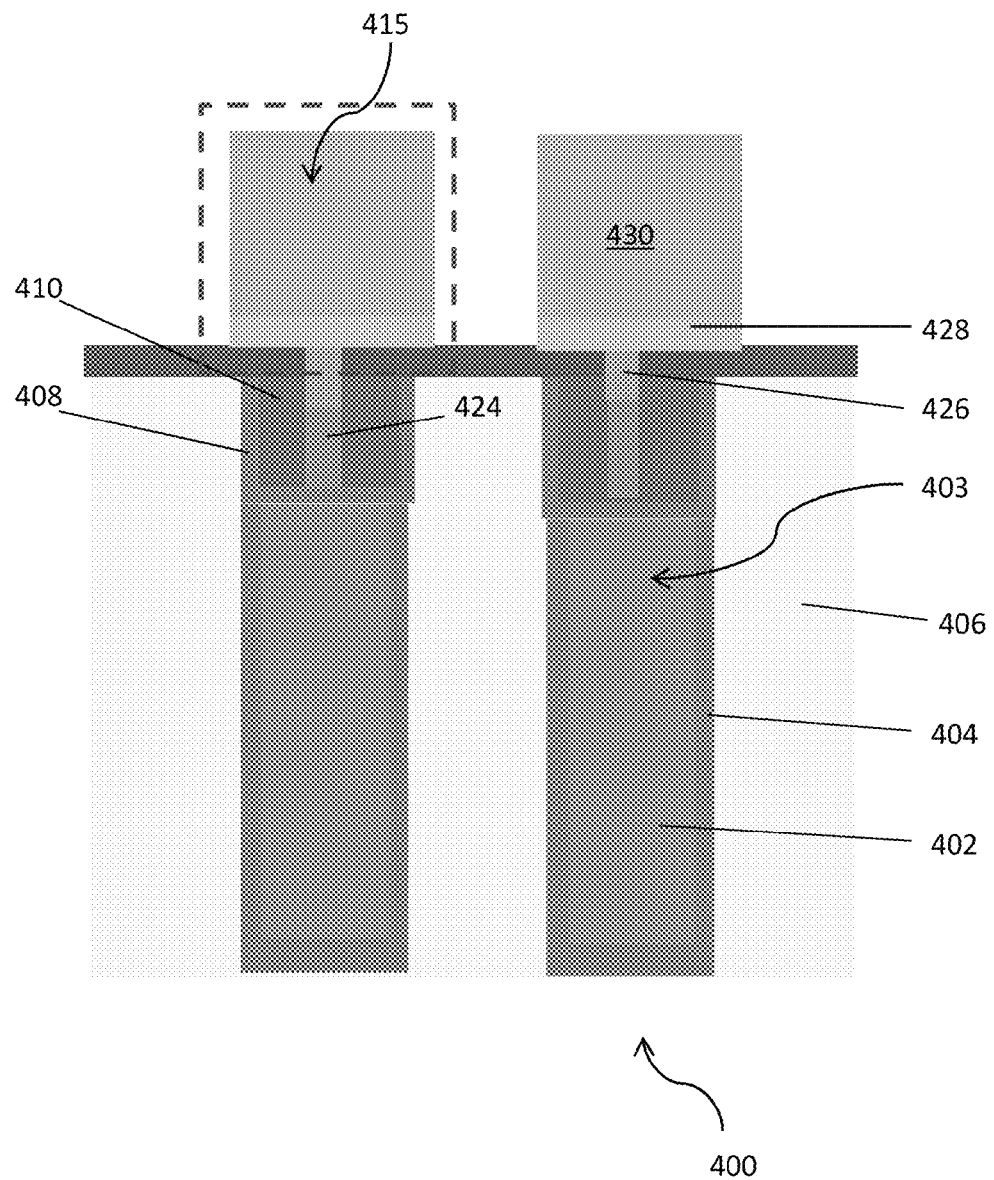
FIG. 17 shows a phase change memory cell after etching vias to form bit lines.
Figure 18:
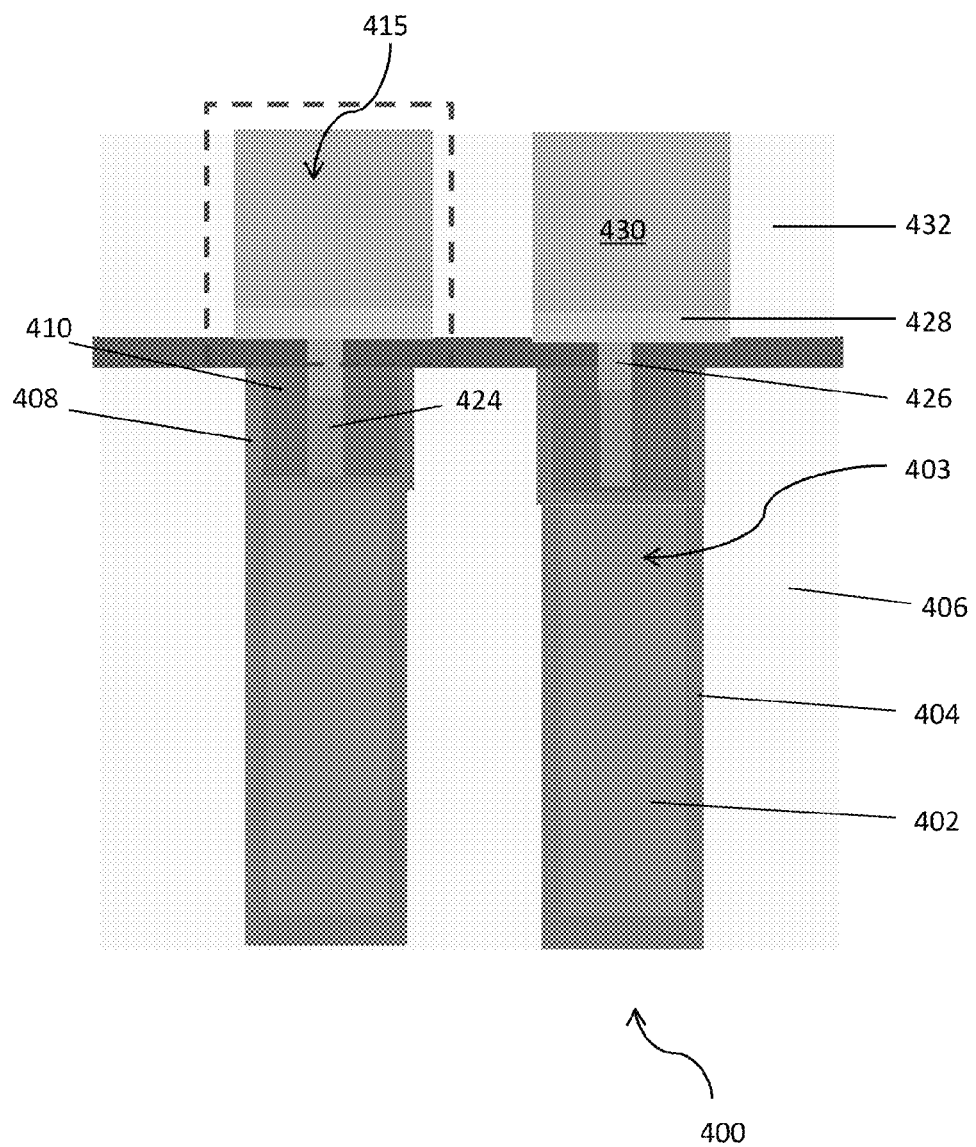
FIG. 18 shows a phase change memory cell after filling the vias with an appropriate dielectric material.

According to yet another embodiment of the invention, after the top electrode formation step, 318, bit lines 415 may be added to the phase change memory cell. Bit lines 415 may be formed by depositing a layer of liner 428 followed by a metal layer 430, as shown in FIG. 16. For example, a bit line 415 may be formed by depositing a layer of tantalum nitride, followed by a layer of copper. In another embodiment, the bit lines 415 may be formed by depositing a layer of titanium nitride, followed by a layer of aluminum, or by a layer of tungsten. The bit lines 415 may then be patterned using photolithography and vias etched across the two layers using a reactive ion etch (RIE) process, as shown in FIG. 17. After the vias are etched, they may be filled with an appropriate dielectric material, as shown in FIG. 18.

Figure 19A:
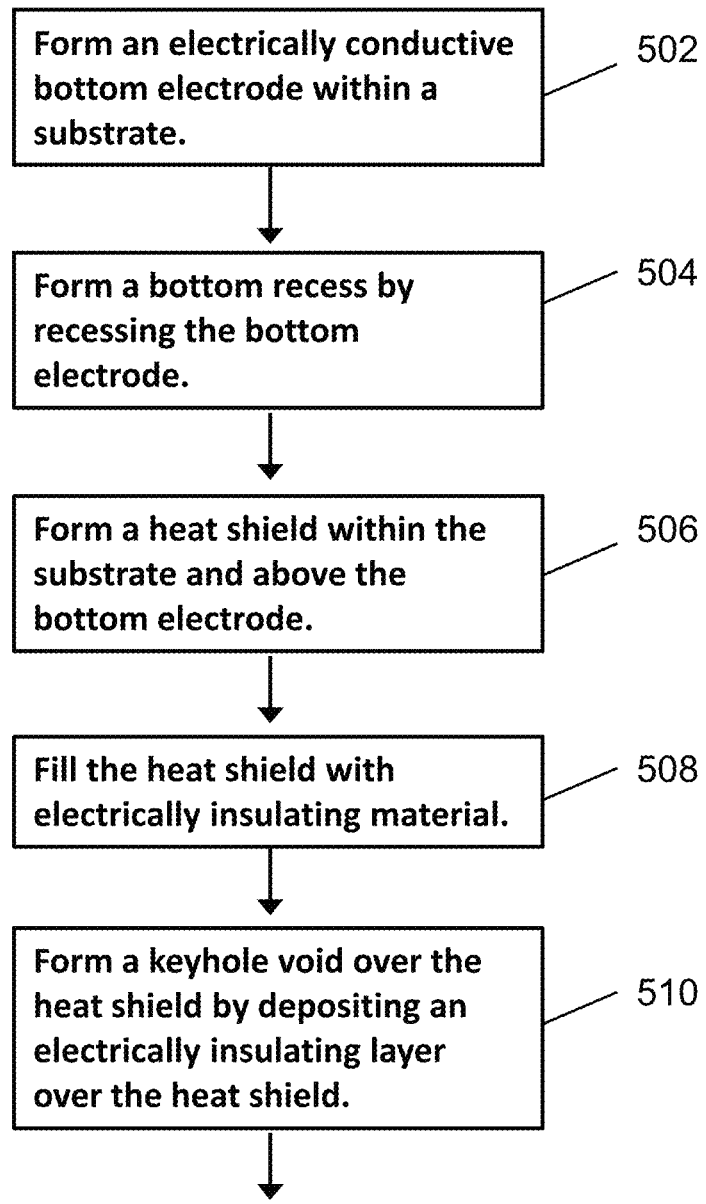
FIGS. 19*a*-19*b* show a continuous flowchart illustrating a second example method for fabricating a phase change memory cell, in accordance with another embodiment of the invention.
Figure 19B:
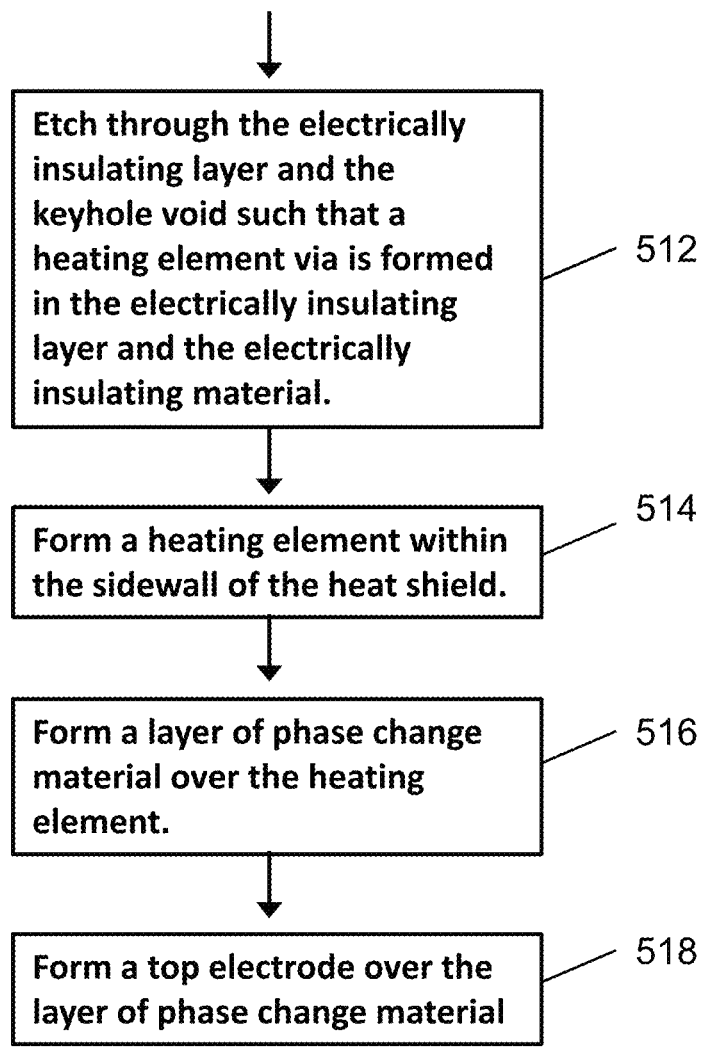

FIGS. 19a-19b show a continuous flowchart illustrating a second example method for fabricating a phase change memory cell, in accordance with another embodiment of the invention. Some of steps of method shown in FIGS. 19a-19b are similar to the steps of the method shown in FIGS. 3a-3b.

The current method involves a bottom electrode formation step 502. During bottom electrode formation step 502, an electrically conductive bottom electrode is formed within a substrate. The bottom electrode may electrically conductive. After bottom electrode formation step 502 is complete, the process proceeds to bottom electrode recessing step 504.

According to one embodiment of the invention, the bottom electrode may consist of a metal core, such as a tungsten structure, surrounded by an outer layer, such as a titanium nitride shell. The outer layer may also include a mixture or titanium nitride and aluminum or a mixture of titanium nitride and silicon. The metal core may be deposited by a chemical vapor deposition process. The outer layer may also be deposited using chemical vapor deposition.

According to another embodiment of the invention, the bottom electrode may connect the phase change memory cell to a substrate or to copper or aluminum lines in layers of material adjacent to the phase change memory cell.

At bottom electrode recessing step 504, a recess was formed by recessing the bottom electrode. According to one embodiment of the invention the bottom electrode may be recessed using a dry etch or a reactive ion etch (RIE). After bottom electrode recessing step 504 is complete, the process proceeds to heat shield formation step 506.

At heat shield formation step 506, a heat shield is formed within the substrate and above the bottom electrode. According to one embodiment of the invention, the heat shield may be thermally conductive. The heat shield may be thermally coupled to the bottom electrode, and the heat shield may include a sidewall and extend away from the bottom electrode.

According to one embodiment of the invention, the heat shield may consist of tantalum nitride, titanium nitride, or titanium nitride mixed with either aluminum or silicon. The heat shield may be formed using a chemical vapor deposition (CVD) process or an atomic layer deposition (ALD) process. The heat shield may also consist of silicon deposited using a low pressure chemical vapor deposition (LP-CVD) process. After heat shield formation step 506 is complete, the process proceeds to insulation step 508.

At insulation step 508, the heat shield is filled with electrically insulating material. According to one embodiment of the invention, the electrically insulating material may be silicon nitride or silicon dioxide. The insulation step may proceed by first overfilling the heat shield with the electrically insulating material and then planarizing the material using a chemical mechanical polishing (CMP) process. The CMP process may consume surface portions of the heat shield material. After insulation step 508 is complete, the process proceeds to keyhole void formation step 510.

At keyhole void insulation step, 510, a keyhole void is formed over the heat shield by depositing an electrically insulating layer over the heat shield. The electrically insulating layer may define the keyhole void.

According to one embodiment of the invention, the keyhole void is formed by first forming a series of layers: an insulation layer, a silicon dioxide layer, a silicon nitride layer, and a photoresist layer, over the insulation-filled heat shield. A recess in these layers is formed by using standard photolithographic techniques remove sections of the photoresist layer. Standard etching techniques may then be used to deepen the recess through the silicon nitride and silicon dioxide layers. For example, the recess may be deepened via a selective wet etch process using either dilute hydrofluoric acid (DHF) or a buffered oxide etch solution (BOE). The remaining photoresist layer may then be stripped using oxygen plasma. In one embodiment of the invention the insulation layer may include silicon nitride or silicon dioxide.

An electrically insulating layer may then be deposited into the newly formed recess, forming a keyhole void. The electrically insulating layer may include amorphous silicon. After keyhole void insulation step 510 is complete, the process proceeds to etching step 512.

At etching step 512, the electrically insulating layer and the keyhole void are etching through such that a heating element via is formed in the electrically insulating layer and the electrically insulating material. The heating element via may terminate at the heat shield. Furthermore, the heating element may be formed within the heating element via.

According to one embodiment of the invention, the keyhole void may be transferred through the electrically insulating layer, insulation layer, and electrically insulating material, using a reactive ion etch process and forming the heating element via. The electrically insulating layer may include amorphous silicon. If the electrically insulating layer includes amorphous silicon, the remaining amorphous silicon may then be removed using tetramethylammonium hydroxide (TMAH). Any remaining surface silicon dioxide may be removed using dilute hydrofluoric acid (DHF). After etching step 512 is complete, the process proceeds to the heating element formation step 514.

At heating element formation step 514, a heating element is formed within the sidewall of the heat shield. The heating element may be electrically coupled to the bottom electrode and configured to generate heat during programming of the phase change memory cell. Furthermore, the electrically insulating material may surround the heating element. After heating element formation step 514 is complete, the process proceeds to phase change material formation step 516.

At phase change material formation step 516, a layer of phase change material is formed over the heating element. The phase change material is selectively settable to at least two states having different electrical resistivity. For example, the phase change material may include a Germanium-Antimony-Tellurium compound (GST). After phase change material formation step 516 is complete, the process proceeds to top electrode formation step 518.

At top electrode formation step 518, a top electrode is formed over the layer of phase change material. The top electrode may be electrically coupled to the layer of phase change material. The top electrode material may include titanium nitride.

According to yet another embodiment of the invention, after top electrode formation step, 518, bit lines may be added to the phase change memory cell. Bit lines may be formed by depositing a layer of liner followed by a metal layer. For example, a bit line may be formed by depositing a layer of tantalum nitride, followed by a layer of copper. In another embodiment, the bit lines may be formed by depositing a layer of titanium nitride, followed by a layer of aluminum, or by a layer of tungsten. The bit lines r may then be patterned using photolithography and vias etched across the two layers using a reactive ion etch (RIE) process, as shown in FIG. 17. After the vias are etched, they may be filled with an appropriate dielectric material, as shown in FIG. 18.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory cell comprising:
    a bottom electrode configured to pass current to the phase change memory cell during programming of the phase change memory cell;
    a heating element electrically coupled to the bottom electrode, the heating element configured to generate heat during programming of the phase change memory cell; and
    a heat shield surrounding at least a portion of the heating element, the heat shield being thermally conductive such that the heat shield conducts heat generated during programming of the phase change memory cell to the bottom electrode.

2. The phase change memory cell of claim 1, further comprising a layer of phase change material electrically coupled to the heating element, the phase change material selectively settable to at least two states having different electrical resistivity.

3. The phase change memory cell of claim 2, wherein the phase change material is thermally configurable.

4. The phase change memory cell of claim 2, wherein the heating element includes a material that is not phase change material.

5. The phase change memory cell of claim 1, further comprising a layer of phase change material electrically coupled to the heating element, the layer of phase change material selectively settable to at least two states having different electrical resistivity.

6. The phase change memory cell of claim 1, further comprising a top electrode electrically coupled to the heating element.

7. The phase change memory cell of claim 6, wherein the heating element includes phase change material, the phase change material selectively settable to at least two states having different electrical resistivity.

8. The phase change memory cell of claim 6:
    wherein the heating element is entirely phase change material, the phase change material selectively settable to at least two states having different electrical resistivity; and
    wherein the top electrode includes a material that is not phase change material.

9. The phase change memory cell of claim 1, further comprising:
    a top electrode electrically coupled to the heating element, the top electrode configured to pass current from the phase change memory cell during programming of the phase change memory cell.

10. A phase change memory array for isolating heat generated during programming of phase change memory cells, the phase change memory array comprising:
    a plurality of phase change memory cells, each of the phase change memory cells including:
    a bottom electrode configured to pass current to the phase change memory cell during programming of the phase change memory cell;
    a heating element electrically coupled to the bottom electrode, the heating element configured to generate heat during programming of the phase change memory cell; and
    a heat shield surrounding at least a portion of the heating element, the heat shield being thermally conductive such that the heat shield conducts heat generated during programming of the phase change memory cell to the bottom electrode.

11. The phase change memory array of claim 10, further comprising a layer of phase change material electrically coupled to the heating element, the layer of phase change material selectively settable to at least two states having different electrical resistivity.

12. The phase change memory array of claim 11, wherein the layer of phase change material is thermally configurable.

13. The phase change memory array of claim 11, wherein the heating element is electrically conductive and includes a material that is not phase change material.

14. The phase change memory array of claim 10, further comprising a top electrode electrically coupled to the heating element.

15. The phase change memory array of claim 14:
    wherein the heating element includes phase change material, the phase change material selectively settable to at least two states having different electrical resistivity; and
    wherein the top electrode includes a material that is not phase change material.

16. The phase change memory cell of claim 15, wherein the phase change material is thermally configurable.

17. The phase change memory array of claim 10, further comprising:
 a top electrode electrically coupled to the heating element, the top electrode configured to pass current from the phase change memory cell during programming of the phase change memory cell.

\* \* \* \* \*